(12) United States Patent
Liu et al.

(10) Patent No.: US 11,177,294 B2
(45) Date of Patent: Nov. 16, 2021

(54) ARRAY SUBSTRATE WITH VIA HOLE STRUCTURES, MANUFACTURING METHOD THEREOF AND DISPLAY DEVICE

(71) Applicant: BOE Technology Group Co., Ltd., Beijing (CN)

(72) Inventors: Dongni Liu, Beijing (CN); Minghua Xuan, Beijing (CN); Li Xiao, Beijing (CN); Detao Zhao, Beijing (CN); Liang Chen, Beijing (CN); Hao Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/701,706

(22) Filed: Dec. 3, 2019

(65) Prior Publication Data

US 2020/0286921 A1 Sep. 10, 2020

(30) Foreign Application Priority Data

Mar. 8, 2019 (CN) .......................... 201910176899.5

(51) Int. Cl.
*H01L 23/48* (2006.01)
*H01L 27/12* (2006.01)
(Continued)

(52) U.S. Cl.
CPC ........ *H01L 27/124* (2013.01); *H01L 21/2885* (2013.01); *H01L 21/7684* (2013.01);
(Continued)

(58) Field of Classification Search
CPC ............... H01L 27/124; H01L 21/2885; H01L 21/76804; H01L 21/7684
See application file for complete search history.

(56) References Cited

U.S. PATENT DOCUMENTS

| 9,281,346 B1* | 3/2016 | Lim ........................ H01L 24/29 |
| 2001/0010272 A1* | 8/2001 | Otsuka ................. H05K 1/0242 |
| | | 174/258 |

(Continued)

FOREIGN PATENT DOCUMENTS

| CN | 104851892 A | 8/2015 |
| CN | 107039377 A | 8/2017 |
| CN | 109817659 A | 5/2019 |

OTHER PUBLICATIONS

Office Action dated Jul. 16, 2020 issued in corresponding Chinese Application No. 201910176899.5 (with English translation).

*Primary Examiner* — Caleb E Henry
(74) *Attorney, Agent, or Firm* — Muncy, Geissler, Olds and Lowe, P.C.

(57) ABSTRACT

An array substrate, a manufacturing method thereof and a display device are provided. A display unit is disposed on a first surface of a base substrate, and a driving circuit is disposed on a second surface of the base substrate opposite to the first surface, the driving circuit is electrically connected with the display unit through a signal connection structure in at least one via structure, a longitudinal section of the at least one via hole is a trapezoid, and a length of a bottom edge of the trapezoid at one side of the trapezoid close to the display unit is larger than a length of a bottom edge of the trapezoid at one side of the trapezoid away from the display unit.

6 Claims, 6 Drawing Sheets

(51) Int. Cl.
*H01L 21/288* (2006.01)
*H01L 21/768* (2006.01)
*H01L 23/522* (2006.01)

(52) U.S. Cl.
CPC .. *H01L 21/76804* (2013.01); *H01L 21/76879* (2013.01); *H01L 23/5226* (2013.01)

(56) References Cited

U.S. PATENT DOCUMENTS

| | | | |
|---|---|---|---|
| 2002/0039814 A1* | 4/2002 | Jada | H01L 27/1255 |
| | | | 438/155 |
| 2016/0307986 A1* | 10/2016 | Gai | H01L 27/1255 |
| 2016/0336532 A1 | 11/2016 | Li | |
| 2017/0012095 A1 | 1/2017 | Zhong et al. | |
| 2018/0277528 A1* | 9/2018 | Hasegawa | H01L 33/58 |
| 2019/0004359 A1 | 1/2019 | Yueh et al. | |
| 2019/0067332 A1* | 2/2019 | Liu | H01L 27/1262 |

* cited by examiner

ARRAY SUBSTRATE WITH VIA HOLE STRUCTURES, MANUFACTURING METHOD THEREOF AND DISPLAY DEVICE

CROSS-REFERENCE TO RELATED APPLICATION

The present application claims the priority of Chinese Patent Application No. 201910176899.5 filed on Mar. 8, 2019, the contents of which are incorporated herein in their entirety by reference.

TECHNICAL FIELD

The present disclosure relates to the field of display technologies, in particular to an array substrate, a manufacturing method thereof and a display device.

BACKGROUND

Currently, as the display market is developing, and consumer's demand for various display products such as laptops, smartphones, TVs, tablet computers, smart watches and fitness wristbands increases continually, more and more new display products will spring up in the future.

At present, most display products have a frame, and usually set a terminal (such as a driving circuit binding area) on a periphery of a display area of a display panel. A full-screen, frameless display product may provide users with a better viewing experience and will definitely set off a new consumer market. Based on this, how to realize the full-screen, frameless display product is a technical problem to be solved urgently by a person skilled in the art.

A full-screen technology has gradually become a mainstream technology of handheld devices such as mobile phones. In order to realize a true frameless display product, the related art proposes a technology of combining a front and back process of a backplane and a micro Light Emitting Diode (LED) transfer method to realize a frameless display, i.e., a display film layer including such thin film transistors is provided on a front surface of a display substrate, and the driving circuit binding area is disposed on a back surface of a display substrate, and a hole is formed in the base substrate of the display substrate, and a metal is filled in the hole to realize a signal connection between the front surface and the back surface.

SUMMARY

The following technical solutions are provided in the embodiments of the present disclosure.

According to some embodiments of the present disclosure, an array substrate is provided, the array substrate includes a base substrate, a display unit and a driving circuit, wherein the display unit is disposed on a first surface of the base substrate, and the driving circuit is disposed on a second surface of the base substrate opposite to the first surface, a plurality of via hole structures are formed in the array substrate, and a size of at least a portion of each of the plurality of via hole structures at one side of the at least the portion of each of the plurality of via hole structures close to the display unit is larger than a size of at least the portion of each of the plurality of via hole structures at one side of the at least the portion of each of the plurality of via hole structures away from the display unit.

Optionally, the driving circuit is electrically connected with the display unit through a signal connection structure in the plurality of via hole structures, and the signal connection structure in the plurality of via hole structures completely fills internal spaces of the plurality of via hole structures.

Optionally, each via hole structure consists of a plurality of via holes connecting with each other, wherein a longitudinal section of at least one of the plurality of via holes is a trapezoid, and a length of a bottom edge of the trapezoid at one side of the trapezoid close to the display unit is larger than a length of a bottom edge of the trapezoid at one side of the trapezoid away from the display unit.

Optionally, a first insulating layer and a second insulating layer are disposed between the base substrate and the display unit, and an etching rate of the second insulating layer is higher than an etching rate of the first insulating layer; the first insulating layer includes a first via hole, a longitudinal section of the first via hole is a first trapezoid, the second insulating layer includes a second via hole, and a longitudinal section of the second via hole is a second trapezoid, a length of a bottom edge of the second trapezoid at one side of the second trapezoid close to the display unit is larger than a length of a bottom edge of the second trapezoid at one side of the second trapezoid away from the display unit.

Optionally, a length of a bottom edge of the first trapezoid at one side of the first trapezoid close to the display unit is smaller than a length of a bottom edge of the first trapezoid at one side of the first trapezoid away from the display unit.

Optionally, a negative photosensitive material layer is disposed between the base substrate and the display unit, the negative photosensitive material layer includes a third via hole, and each of the plurality of via hole structures is composed of the third via hole, a longitudinal section of the third via hole is a third trapezoid, a length of a bottom edge of the third trapezoid at one side of the third trapezoid close to the display unit is larger than a length of a bottom edge of the third trapezoid at one side of the third trapezoid away from the display unit.

Optionally, the signal connection structure is a metal filling formed by electroplating, and the signal connection structure is respectively connected with a signal input terminal of the display unit and a signal output terminal of the driving circuit.

A display device including the array substrate described above is provided.

A method for manufacturing an array substrate is provided, wherein a display unit is disposed on a first surface of the base substrate, a driving circuit is disposed on a second surface of the base substrate opposite to the first surface, the method includes:

forming a plurality of via hole structures in the array substrate, wherein a size of at least a portion of each of the plurality of via hole structures at one side of the at least the portion of each of the plurality of via hole structures close to the display unit is larger than a size of at least the portion of each of the plurality of via hole structures at one side of the at least the portion of each of the plurality of via hole structures away from the display unit.

Optionally, forming the plurality of via hole structures in the array substrate includes:

forming a plurality of via holes connecting with each other, wherein a longitudinal section of at least one of plurality of the via holes is a trapezoid, and a length of a bottom edge of the trapezoid at one side of the trapezoid close to the display unit is larger than a length of a bottom edge of the trapezoid at one side of the trapezoid away from the display unit.

Optionally, the forming the plurality of via hole structures in the array substrate includes:

forming a first insulating layer and a second insulating layer sequentially between the base substrate and the display unit, wherein an etching rate of the second insulating layer is higher than an etching rate of the first insulating layer;

etching the first insulating layer and the second insulating layer to form a first via hole extending through the first insulating layer and a second via hole extending through the second insulating layer respectively, wherein a longitudinal section of the first via hole is a first trapezoid, a longitudinal section of the second via hole is a second trapezoid, the first via hole and the second via hole are connected with each other to form a via hole structure, a length of a bottom edge of the first trapezoid at one side of the first trapezoid close to the display unit is smaller than a length of a bottom edge of the first trapezoid at one side of the first trapezoid away from the display unit, a length of a bottom edge of the second trapezoid at one side of the second trapezoid close to the display unit is larger than a length of a bottom edge of the second trapezoid at one side of the second trapezoid away from the display unit.

Optionally, the forming the plurality of via hole structures in the array substrate includes:

forming a negative photosensitive material layer on the base substrate;

forming a plurality of third via holes extending through the negative photosensitive material layer by exposing and developing the negative photosensitive material layer, wherein each of the plurality of via hole structures is composed of a third via hole, a longitudinal section of the third via hole is a third trapezoid, a length of a bottom edge of the third trapezoid at one side of the third trapezoid close to the display unit is larger than a length of a bottom edge of the third trapezoid at one side of the third trapezoid away from the display unit.

Optionally, subsequent to forming the plurality of via hole structures in the array substrate, the method further includes:

forming a conductive pattern in the plurality of via hole structures by an electroplating process;

polishing the conductive pattern by a chemical mechanical polishing process to form a signal connection structure, wherein the signal connection structure is respectively connected with a signal input terminal of the display unit and a signal output terminal of the driving circuit.

Optionally, the base substrate is a flexible substrate, the method includes:

providing a rigid carrier plate;

forming the flexible substrate on the rigid carrier plate;

forming the first insulating layer and the second insulating layer on the flexible substrate, wherein the etching rate of the second insulating layer is higher than the etching rate of the first insulating layer;

forming an electroplating seed layer and the display unit on the second insulating layer, wherein the electroplating seed layer is connected with a signal input terminal of the display unit;

forming a protective film covering the display unit;

removing the flexible substrate from the rigid carrier plate;

etching the flexible substrate, the first insulating layer and the second insulating layer from a side of the flexible substrate away from the display unit, and forming a substrate via hole extending through the flexible substrate, the first via hole extending through the first insulating layer and the second via hole extending through the second insulating layer, wherein orthographic projections of the first via hole and the second via hole on the flexible substrate are located within that of the substrate via hole, the longitudinal section of the first via hole is the first trapezoid, the longitudinal section of the second via hole is the second trapezoid, the first via hole and the second via hole are connected with each other to form a via hole structure, the electroplating seed layer is exposed by the plurality of via hole structures, the length of the bottom edge of the first trapezoid at one side of the first trapezoid close to the display unit is smaller than the length of the bottom edge of the first trapezoid at one side of the first trapezoid away from the side of the display unit, the length of the bottom edge of the second trapezoid at one side of the second trapezoid close to the display unit is larger than the length of the bottom edge of the second trapezoid at one side of the second trapezoid away from the display unit;

forming a conductive pattern in the substrate via hole, the first via hole and the second via hole by an electroplating process, wherein the conductive pattern is in contact with the electroplating seed layer;

polishing a surface of the conductive pattern protruding from the flexible substrate by a chemical mechanical polishing process to form a signal connection structure;

binding a driving circuit connected with the signal connection structure to the side of the flexible substrate away from the display unit, wherein the signal connection structure is connected with a signal output terminal of the driving circuit;

removing the protective film;

transferring a micro light-emitting diode on a side of the display unit away from the flexible substrate.

Optionally, the base substrate is a flexible substrate, the method includes:

providing a rigid carrier plate;

forming the flexible substrate on the rigid carrier plate;

forming the negative photosensitive material layer on the flexible substrate;

forming an electroplating seed layer and the display unit on the negative photosensitive material layer, wherein the electroplating seed layer is connected with a signal input terminal of the display unit;

forming a protective film covering the display unit;

removing the negative photosensitive material layer from the flexible substrate;

etching the flexible substrate, the negative photosensitive material layer from one side of the flexible substrate away from the display unit, and forming a substrate via hole extending through the flexible substrate and the third via hole extending through the negative photosensitive material layer, wherein an orthographic projection of the third via hole on the flexible substrate is located within that of the substrate via hole, the longitudinal section of the third via hole is the third trapezoid, the electroplating seed layer is exposed by the third via hole, the length of the bottom edge of the third trapezoid at one side of the third trapezoid close to the display unit is larger than the length of the bottom edge of the third trapezoid at one side of the third trapezoid away from the display unit;

forming a conductive pattern in the substrate via hole and the third via hole by an electroplating process, wherein the conductive pattern is in contact with the electroplating seed layer;

polishing a surface of the conductive pattern protruding from the flexible substrate by a chemical mechanical polishing process to form a signal connection structure;

binding a driving circuit connected with the signal connection structure to the side of the flexible substrate away from the display unit, wherein the signal connection structure is connected with a signal output terminal of the driving circuit;

removing the protective film;

transferring a micro light-emitting diode on a side of the display unit away from the flexible substrate.

DETAILED DESCRIPTION

In order to illustrate the technical problems, the technical solutions and merits of the present disclosure in a clearer manner, the drawings desired for the present disclosure will be described hereinafter briefly.

At present, most display products have a frame, and usually set a terminal (such as a driving circuit binding area) on a periphery of a display area of a display panel. A full-screen, frameless display product may provide users with a better viewing experience and will definitely set off a new consumer market. Based on this, how to realize the full-screen, frameless display product is a technical problem to be solved urgently in the art. A full-screen technology has gradually become a mainstream technology of handheld devices such as mobile phones. In order to realize a true frameless display product, a technology of combining a front and back process of a backplane and a micro Light Emitting Diode (LED) transfer method is proposed to realize a frameless display, i.e., a display film layer including such thin film transistors is provided on a front surface of an array substrate, and the driving circuit binding area is disposed on a back surface of the array substrate, and a hole is formed in the base substrate of the array substrate, and a metal is filled in the hole to realize a connection between a front signal and a back signal.

Figure 1:
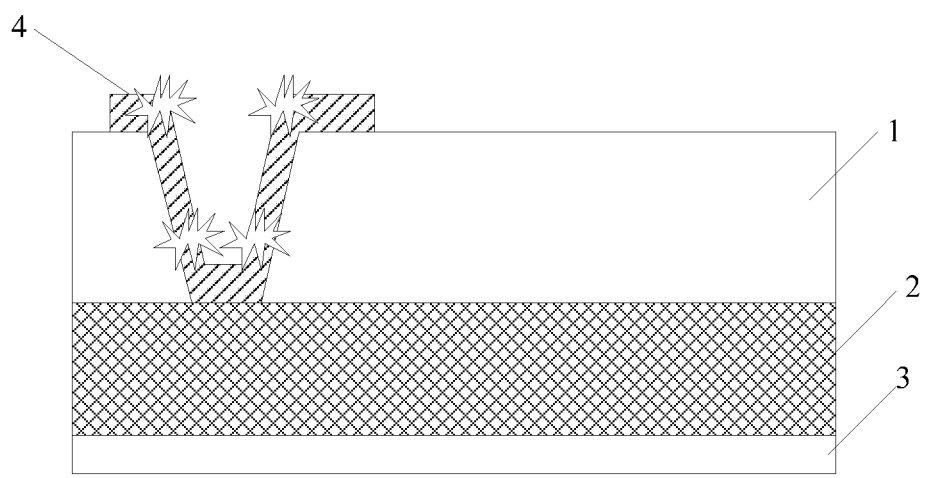
FIG. 1 is a schematic diagram illustrating a signal connection structure with breaks.
Figure 2:
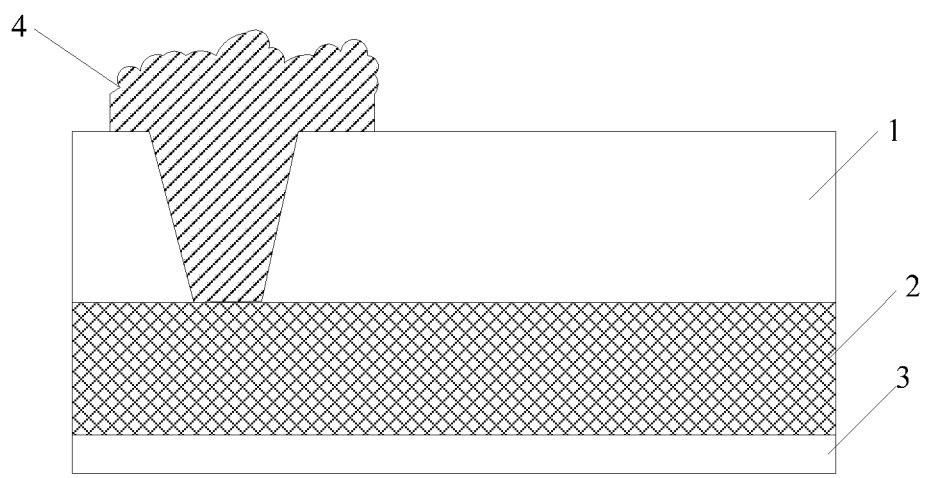
FIG. 2 is a schematic diagram illustrating an uneven surface of the signal connection structure formed by electroplating.

In the related art, there are generally two ways to fill in via holes with metal, the first way is sputtering, that is, after the via hole is formed, a signal connection structure 4 connecting the front side and the back side of the array substrate is formed in the via hole by sputtering. However, since the base substrate is thick, a slope angle of the via hole is small and a depth of the via hole is large, as shown in FIG. 1, a circuit break may occur in the signal connection structure 4 easily, and then an abnormal connection occurs, which affects a display effect of a display product. The second way is electroplating, that is, after the via hole is formed, as shown in FIG. 2, the signal connection structure 4 connecting the front side and the back side of the array substrate is formed in the via hole by electroplating, but after the signal connection structure 4 is formed by electroplating, a surface of the signal connection structure 4 is uneven. In order to perform a subsequent IC bonding process, the surface of the signal connection structure 4 needs to be flattened, that is, a chemical mechanical polishing (CMP) process is used for removing a thick metal, but an adhesion force between the metal and the base substrate is small. When the CMP process is carried out, the metal is easy to fall off, and then the abnormal connection occurs, which affects the display effect of the display product.

In order to solve the above problems, and an array substrate, a manufacturing method thereof, and a display device are provided in the embodiments of the present disclosure, which may improve the display effect of the display device.

An array substrate is provided in the embodiments of the present disclosure, a display unit is disposed on a first surface of a base substrate of the array substrate, and a driving circuit is disposed on a second surface of the base substrate opposite to the first surface, the driving circuit is connected with the display unit through a signal connection structure in at least one via hole structure, at least a portion of a longitudinal section of the via hole structure is a trapezoid, and a length of a bottom edge of the trapezoid at one side of the trapezoid close to the display unit is larger than a length of a bottom edge of the trapezoid at one side of the trapezoid away from the display unit.

In the embodiment, the driving circuit is connected with the display unit through the signal connection structure in at least one via hole structure, at least a portion of the longitudinal section of the via hole structure is the trapezoid, and the length of the bottom edge of the trapezoid at one side of the trapezoid close to the display unit is larger than the length of the bottom edge of the trapezoid at one side of the trapezoid away from the display unit. Thus, after a conductive pattern for connecting a signal input terminal of the display unit and a signal output terminal of the driving circuit is formed in the via hole structure by an electroplating process, the conductive pattern may be embedded in the via hole structure, which may increase an adhesion force between the conductive pattern and the array substrate. When the conductive pattern is polished by a chemical mechanical polishing process to form the signal connection structure in subsequent process, the conductive pattern is not easily detached from the array substrate, thereby reducing a probability of the conductive pattern falling off from the array substrate during the chemical mechanical polishing process, avoiding an abnormal connection and ensuring the display effect of the display device.

According to some embodiments of the present disclosure, a longitudinal section of the entire via hole structure may be set to be a trapezoid, and a length of a bottom edge of the trapezoid at one side of the trapezoid close to the display unit is larger than a length of a bottom edge of the trapezoid at one side of the trapezoid away from the display unit. According to other embodiments, only a longitudinal section of a portion of the via hole structure may be set to be a trapezoid, and a length of a bottom edge of the trapezoid at one side of the trapezoid close to the display unit is larger than a length of a bottom edge of the trapezoid at one side of the trapezoid away from the display unit. Thus, the signal connection structure formed in the portion may act as an anchor structure in subsequent process, the signal connection structure is not easily detached from the array substrate, the abnormal connection is avoided and the display effect of the display device is ensured.

In order to further enhance the adhesion force between the conductive pattern and the array substrate, a plurality of via structures may be provided at a connection between the driving circuit and the display unit, i.e., the driving circuit is electrically connected with the display unit through the signal connection structures in the plurality of via structures. Thus, after the conductive pattern is formed in the via hole structure by the electroplating process, the conductive pattern may be embedded in the plurality of via hole structures, which may increase the adhesion force between the conductive pattern and the array substrate. When the conductive pattern is polished by the chemical mechanical polishing process to form the signal connection structure in subsequent process, the conductive pattern is not easily detached from the array substrate, thereby reducing the probability of the conductive pattern falling off from the array substrate during the chemical mechanical polishing process, avoiding the abnormal connection and ensuring the display effect of the display device.

In one embodiment, a first insulating layer and a second insulating layer are disposed between the base substrate and the display unit, and an etching rate of the second insulating layer is higher than an etching rate of the first insulating layer; the first insulating layer includes a first via hole, a longitudinal section of the first via hole is a first trapezoid, the second insulating layer includes a second via hole, and a longitudinal section of the second via hole is a second trapezoid, a length of a bottom edge of the first trapezoid at one side of the first trapezoid close to the display unit is smaller than a length of a bottom edge of the first trapezoid at one side of the first trapezoid away from the display unit, a length of a bottom edge of the second trapezoid at one side of the second trapezoid close to the display unit is larger than a length of a bottom edge of the second trapezoid at one side of the second trapezoid away from the display unit.

In the array substrate of the embodiment, after the conductive pattern is formed by the electroplating process, the conductive pattern is filled within the first via hole, the second via hole, and the substrate via hole, and the longitudinal section of the second via hole is the second trapezoid, and the length of the bottom edge of the second trapezoid at one side of the second trapezoid close to the display unit is larger than the length of the bottom edge of the second trapezoid at one side of the second trapezoid away from the display unit, thus a size of a portion of the conductive pattern located in the second via hole at one side close to the display unit is larger than a size at one side away from the display unit, which may enhance the adhesion force between the conductive pattern and the array substrate. When the conductive pattern is polished by the chemical mechanical polishing process to form the signal connection structure in subsequent process, the conductive pattern is not easily detached from the array substrate, thereby reducing the probability of the conductive pattern falling off from the array substrate during the chemical mechanical polishing process, avoiding the abnormal connection and ensuring the display effect of the display device.

In another embodiment, a negative photosensitive material layer is disposed between the base substrate and the display unit, the negative photosensitive material layer includes a third via hole, and each of the plurality of via hole structures is composed of the third via hole, a longitudinal section of the third via hole is a third trapezoid, a length of a bottom edge of the third trapezoid at one side of the third trapezoid close to the display unit is larger than a length of a bottom edge of the third trapezoid at one side of the third trapezoid away from the display unit.

In the array substrate of the embodiment, after the conductive pattern is formed by the electroplating process, the conductive pattern is filled in the third via hole and the substrate via hole, and the longitudinal section of the third via hole is the third trapezoid, and the length of the bottom edge of the third trapezoid at one side of the third trapezoid close to the display unit is larger than the length of the bottom edge of the third trapezoid at one side of the third trapezoid away from the display unit, thus a size of a portion of the conductive pattern located in the third via hole at one side of the portion of the conductive pattern located in the second via hole close to the display unit is larger than a size of the portion of the conductive pattern located in the third via hole at one side of the portion of the conductive pattern located in the third via hole away from the display unit, which may increase the adhesion force between the conductive pattern and the array substrate. When the conductive pattern at one side of the array substrate away from the display unit is polished by the chemical mechanical polishing process in subsequent process, the conductive pattern is not easily detached from the array substrate, thereby reducing the probability of the conductive pattern falling off from the array substrate during the chemical mechanical polishing process, avoiding the abnormal connection and ensuring the display effect of the display device.

Further, the array substrate further includes:

a signal connection structure located in the via hole structure, wherein the signal connection structure is respectively connected with a signal input terminal of the display unit and a signal output terminal of the driving circuit.

The signal connection structure may enable the connection between the display unit and the driving circuit, and since the display unit and the driving circuit are located on different sides of the base substrate, a frameless display product can be realized.

According to some embodiments of the present disclosure, the signal connection structure may be a metal filling formed by electroplating, such as an electroplated copper. The above-mentioned electroplated copper fills the via hole structure to form a structure consistent with the internal space of the via hole structure, thereby reducing the probability of the conductive pattern falling off from the array substrate during the chemical mechanical polishing process when being embedded in the via structure.

A display device including the above array substrate is further provided in the embodiments of the present disclosure. The display device may be any product or component with a display function, such as a television, a display, a digital photo frame, a mobile phone, a tablet computer, etc., the display device further includes a flexible circuit board, a printed circuit board, and a backboard.

A method for manufacturing an array substrate is also provided, wherein a display unit is disposed on a first surface of the base substrate, a driving circuit is disposed on a second surface of the base substrate opposite to the first surface, the method includes:

forming at least one via hole structure in the array substrate for connecting the driving circuit and the display unit, wherein a longitudinal section of at least a portion of the at least one via hole structure is trapezoid, a length of a bottom edge of the trapezoid at one side of the trapezoid close to the display unit is larger than a length of a bottom edge of the trapezoid at one side of the trapezoid away from the display unit.

In the embodiment, the driving circuit is connected with the display unit through the at least one via hole structure, the longitudinal section of at least the portion of the at least one the via hole structure is the trapezoid, and the length of the bottom edge of the trapezoid at one side of the trapezoid close to the display unit is larger than the length of the bottom edge of the trapezoid at one side of the trapezoid away from the display unit. Thus, after a conductive pattern for connecting a signal input terminal of the display unit and a signal output terminal of the driving circuit is formed in the via hole structure by an electroplating process, the conductive pattern may be embedded in the via hole structure, which may increase the adhesion force between the conductive pattern and the array substrate. When the conductive pattern is polished by a chemical mechanical polishing process to form the signal connection structure in subsequent process, the conductive pattern is not easily detached from the array substrate, thereby reducing a probability of the conductive pattern falling off from the array substrate during the chemical mechanical polishing process, avoiding an abnormal connection and ensuring the display effect of the display device.

Further, according to some embodiments of the present disclosure, a longitudinal section of at least a portion of the via structure described above may also be configured to have shape other than trapezoid, provided that a size of the longitudinal section at one side of the longitudinal section close to the display unit is larger than that at one side away from the display unit. As described above, with reference to the examples shown in FIG. 5 and FIG. 12, when a similar portion with "narrow top and wide bottom" is included in the via hole structure, even if a longitudinal section of the portion do not form a trapezoidal shape, a similar fixing effect can be realized by the via hole structure, so that the conductive pattern is not easily detached from the array substrate.

In one embodiment, forming the plurality of via hole structures in the array substrate includes:

forming a first insulating layer and a second insulating layer sequentially on the base substrate, wherein an etching rate of the second insulating layer is higher than an etching rate of the first insulating layer;

etching the first insulating layer and the second insulating layer to form a first via hole extending through the first insulating layer and a second via hole extending through the second insulating layer respectively, wherein a longitudinal section of the first via hole is a first trapezoid, a longitudinal section of the second via hole is a second trapezoid, the first via hole and the second via hole are connected with each other to form a via hole structure, a length of a bottom edge of the second trapezoid at one side of the second trapezoid close to the display unit is larger than a length of a bottom edge of the second trapezoid at one side of the second trapezoid away from the display unit.

In the array substrate of the embodiment, after the conductive pattern is formed by the electroplating process, the first via hole, the second via hole and the substrate via hole are filled with the conductive pattern, and the longitudinal section of the second via hole is the second trapezoid, and the length of the bottom edge of the second trapezoid at one side of the second trapezoid close to the display unit is larger than the length of the bottom edge of the second trapezoid at one side of the second trapezoid away from the display unit, thus a size of a portion of the conductive pattern located in the second via hole at one side of the portion of the conductive pattern located in the second via hole close to the display unit is larger than a size of the portion of the conductive pattern located in the second via hole at one side of the portion of the conductive pattern located in the second via hole away from the display unit, which may enhance the adhesion force between the conductive pattern and the array substrate. When the conductive pattern at one side of the array substrate away from the display unit is polished by the chemical mechanical polishing process, the conductive pattern is not easily detached from the array substrate, thereby reducing the probability of the conductive pattern falling off from the array substrate during the chemical mechanical polishing process, avoiding the abnormal connection and ensuring the display effect of the display device.

When the first via hole and the second via hole are formed by using an etching process as described above, a length of a bottom edge of the first trapezoid at one side of the first trapezoid close to the display unit is smaller than a length of a bottom edge of the first trapezoid at one side of the first trapezoid away from the display unit. However, the technical solution of the present disclosure is not limited thereto. When the first via hole is formed by, for example, other types of processes, the longitudinal section of the obtained first via hole may be different from the above trapezoidal shape, and the fixing effect realized by the conductive pattern in the second via hole is not affected by the shape of the first via hole.

In one embodiment, forming the plurality of via hole structures in the array substrate includes:

forming a negative photosensitive material layer on the base substrate;

exposing and developing the negative photosensitive material layer, and forming a third via hole extending through the negative photosensitive material layer, wherein each of the plurality of via hole structures is composed of a third via hole, a longitudinal section of the third via hole is a third trapezoid, a length of a bottom edge of the third trapezoid at one side of the third trapezoid close to the display unit is larger than a length of a bottom edge of the third trapezoid at one side of the third trapezoid away from the display unit.

In the array substrate of the embodiment, after the conductive pattern is formed by the electroplating process, the conductive pattern is filled in the third via hole and the substrate via hole, and the longitudinal section of the third via hole is the third trapezoid, and the length of the bottom edge of the third trapezoid at one side of the third trapezoid close to the display unit is larger than the length of the bottom edge of the third trapezoid at one side of the third trapezoid away from the display unit, thus a size of a portion of the conductive pattern located in the third via hole at one side of the portion of the conductive pattern located in the third via hole close to the display unit is larger than a size of the portion of the conductive pattern located in the third via hole at one side of the portion of the conductive pattern located in the third via hole away from the display unit, which may increase the adhesion force between the conductive pattern and the array substrate. When the conductive pattern at one side of the array substrate away from the display unit is polished by the chemical mechanical polishing process in subsequent process, the conductive pattern is not easily detached from the array substrate, thereby reducing the probability of the conductive pattern falling off from the array substrate during the chemical mechanical polishing process, avoiding the abnormal connection and ensuring the display effect of the display device.

In an example, subsequent to forming the plurality of via hole structures in the array substrate, the method further includes:

forming a conductive pattern in the plurality of via hole structures by an electroplating process;

polishing the conductive pattern by a chemical mechanical polishing process to form a signal connection structure, wherein the signal connection structure is respectively connected with a signal input terminal of the display unit and a signal output terminal of the driving circuit.

Of course, the method of polishing the conductive pattern is not limited to the chemical mechanical polishing method, and other methods may be adopted.

The technical solutions of the present disclosure will be further described below with reference to the drawings and embodiments.

According to some embodiments of the present disclosure, the base substrate is a flexible substrate, the method for manufacturing the array substrate may include the following steps.

Figure 3:
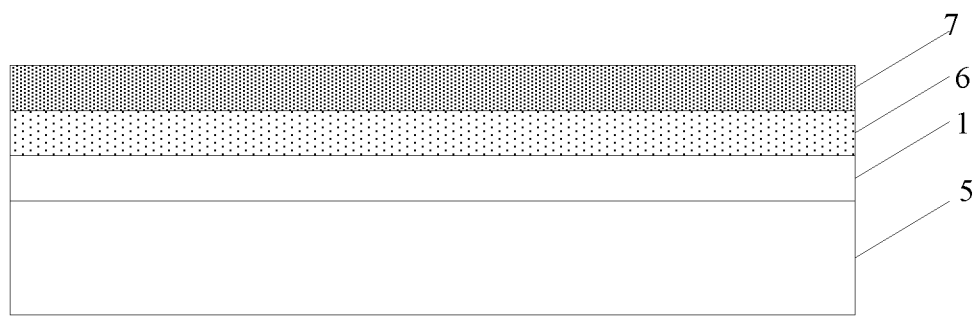
FIG. 3 is a schematic diagram illustrating forming a flexible substrate, a first insulating layer and a second insulating layer on a rigid carrier plate according to one embodiment of the present disclosure.

Step 1: as shown in FIG. 3, a rigid carrier plate 5 is provided, a flexible substrate 1 is formed on the rigid carrier plate 5, and a first insulating layer 6 and a second insulating layer 7 are formed on the flexible substrate 1 subsequently.

The rigid carrier plate 5 may be a glass substrate or a quartz substrate; optionally, a layer of polyimide may be coated on the rigid carrier plate 5 to form the flexible substrate 1.

An etching rate of the second insulating layer 7 is higher than an etching rate of the first insulating layer 6. The material used for the first insulating layer and the second insulating layer is not limited, as long as an insulation therebetween is satisfied and the etching rate of the second insulating layer 7 is higher than the etching rate of the first insulating layer 6. Optionally, the first insulating layer 6 may be made of organic resin, and the second insulating layer 7 may be made of silicon oxide (SiOx) or silicon nitride (SiNx).

Figure 4:
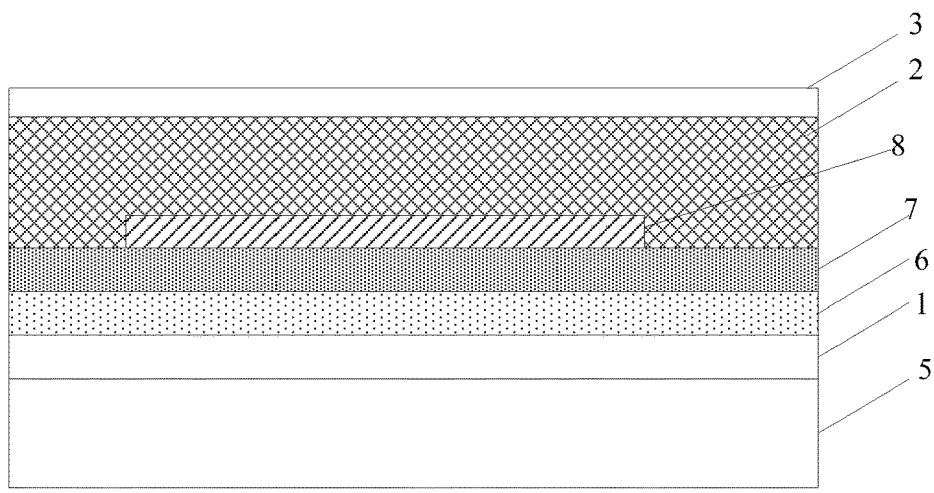
FIG. 4 is a schematic diagram after forming an electroplating seed layer, a display unit, and a protective film according to one embodiment of the present disclosure.

Step 2: as shown in FIG. 4, an electroplating seed layer 8 and a display unit 2 are formed on the second insulating layer 7, the electroplating seed layer 8 is connected with a signal input terminal of the display unit 2, and a protective film 3 is formed to cover the display unit 2;

The electroplating seed layer 8 is used for a subsequent electroplating process and is made of conductive material; the display unit 2 includes a thin film transistor, an anode, a light emitting layer and a cathode, and may realize display under driving of an electric signal, and the signal input terminal of the display unit 2 is connected with the electroplating seed layer 8, and an electrical signal input through the electroplating seed layer 8 may drive the display unit 2 to display.

The protective layer 3 is resistant to high temperatures and may protect the display unit 2 in subsequent process processes.

Figure 5:
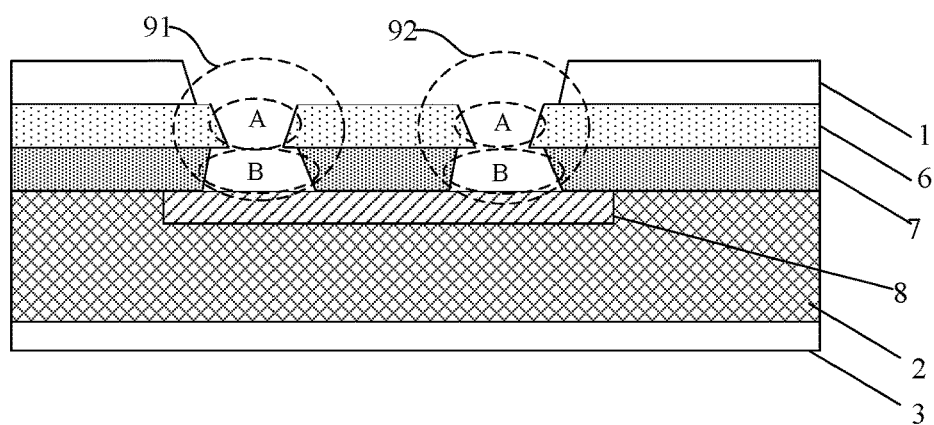
FIG. 5 is a schematic diagram after forming a substrate via hole, a first via hole, and a second via hole according to one embodiment of the present disclosure.

Step 3: as shown in FIG. 5, the flexible substrate 1 is removed from the rigid carrier plate 5, etching is performed on the flexible substrate 1, the first insulating layer 6 and the second insulating layer 7 from one side of the flexible substrate 1 away from the display unit 2 to form a via hole structure 91 and a via hole structure 92.

The via hole structure 91 and the via hole structure 92 are respectively composed of a substrate via hole extending through the flexible substrate 1, a first via hole A extending through the first insulating layer 6, and a second via hole B extending through the second insulating layer 7, respectively. An orthographic projection of the first via hole A and the second via hole B on the flexible substrate 1 falls within the substrate via hole, a longitudinal section of the first via hole A is a first trapezoid, and a longitudinal section of the second via hole B is a second trapezoid. The electroplating seed layer 8 is exposed by the via hole structure 91 and the via hole structure 92.

Since the etching rate of the second insulating layer 7 is higher than the etching rate of the first insulating layer 6, the length of the bottom edge of the first trapezoid at one side of the first trapezoid close to the display unit is smaller than the length of the bottom edge of the first trapezoid at one side of the first trapezoid away from the side of the display unit, the length of the bottom edge of the second trapezoid at one side of the second trapezoid close to the display unit is larger than the length of the bottom edge of the second trapezoid at one side of the second trapezoid away from the display unit. That is, a portion of the via hole structure for connecting a driving circuit and the display unit, i.e. the second via hole B, has a trapezoid longitudinal section, and a length of a bottom edge of the trapezoid at one side of the trapezoid close to the display unit is larger than a length of a bottom edge of the trapezoid at one side of the trapezoid away from the display unit.

The via hole structure in the array substrate of the present disclosure is not limited to the specific configuration described in the above examples. For example, the longitudinal section of the via hole structure for connecting the driving circuit and the display unit is not limited to a trapezoidal shape.

According to the solutions of the present disclosure, as long as a size of at least a portion of each of the plurality of via hole structures at one side of the at least the portion of each of the plurality of via hole structures close to the display unit is larger than a size of at least the portion of each of the plurality of via hole structures at one side of the at least the portion of each of the plurality of via hole structures away from the display unit, a signal connection structure 4 (electroplated Cu) subsequently formed in the portion may have a corresponding shape, so that the signal connection structure 4 may act as an anchor structure, and is not easily detached from the array substrate, then the abnormal connection is avoided.

Figure 6:
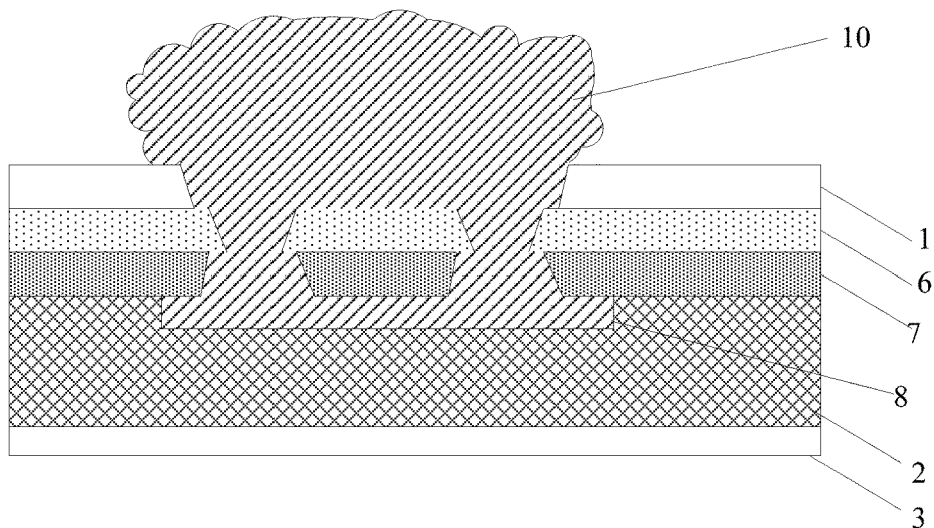
FIG. 6 is a schematic diagram illustrating forming a conductive pattern by using an electroplating process according to one embodiment of the present disclosure.

Step 4: as shown in FIG. 6, a conductive pattern 10 is formed in the substrate via hole 91 and the substrate via hole 92 by an electroplating process, the conductive pattern 10 is in contact with the electroplating seed layer 8.

Figure 7:
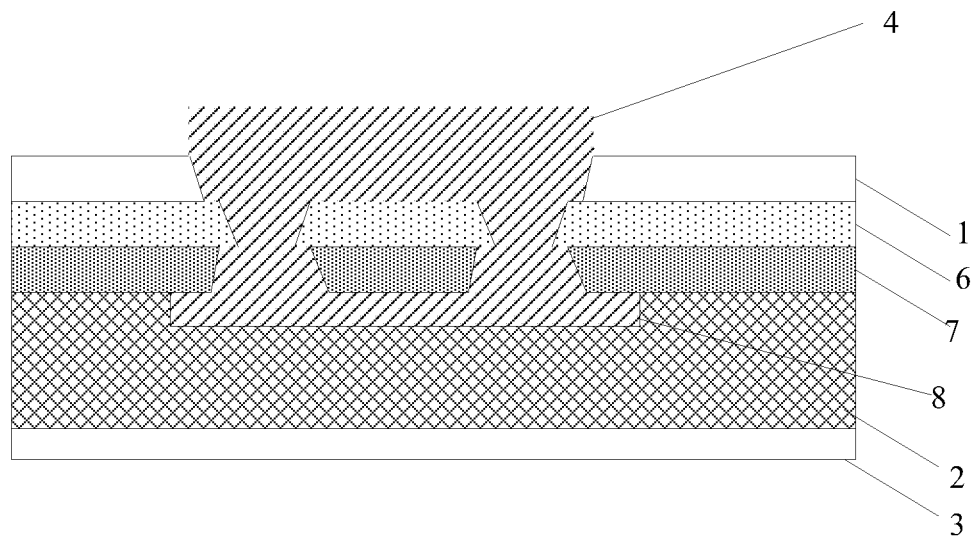
FIG. 7 is a schematic diagram illustrating forming the signal connection structure by performing a CMP process on a pair of conductive patterns according to one embodiment of the present disclosure.

Step 5: as shown in FIG. 7, a surface of the conductive pattern 10 protruding from the flexible substrate is polished by a chemical mechanical polishing process to form the signal connection structure 4.

Since a size of a portion of the conductive pattern 10 located in the second via hole B at one side of the portion of the conductive pattern 10 located in the second via hole B close to the display unit 2 is larger than a size of the portion of the conductive pattern 10 located in the second via hole B at one side of the portion of the conductive pattern 10 located in the second via hole B away from the display unit 2, the portion of the conductive pattern 10 located in the second via hole B may act as an anchor structure, which may increase the adhesion force between the conductive pattern 10 and the array substrate. When the conductive pattern 10 is polished by the chemical mechanical polishing process, the conductive pattern 10 is not easily detached from the array substrate, thereby reducing the probability of the conductive pattern falling off from the array substrate during the chemical mechanical polishing process, avoiding the abnormal connection and ensuring the display effect of the display device.

Figure 8:
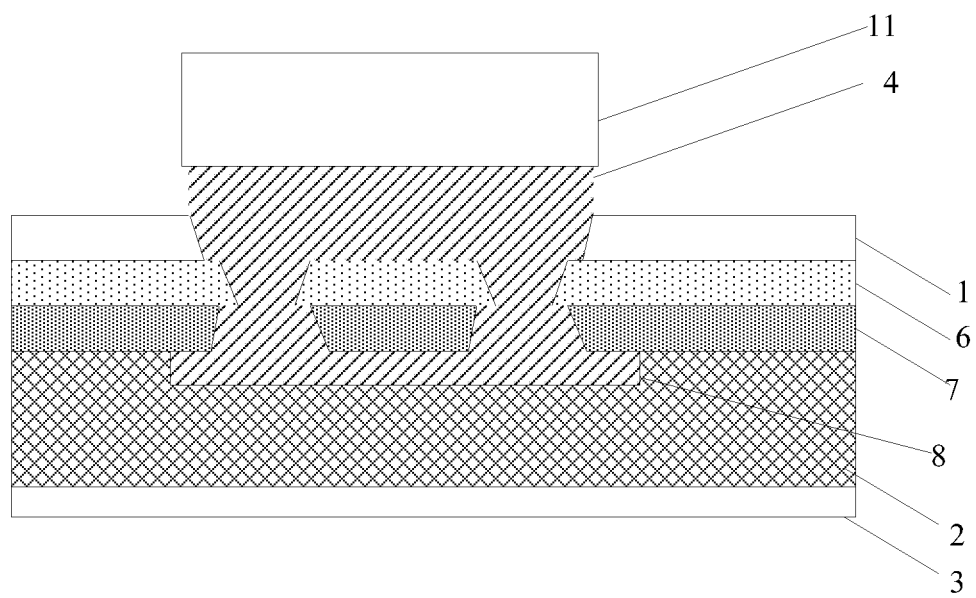
FIG. 8 is a schematic diagram after binding a driving circuit according to one embodiment of the present disclosure.

Step 6: as shown in FIG. 8, binding a driving circuit 11 to one side of the flexible substrate 1 away from the display unit 2 is completed, the signal connection structure 4 is connected with a signal output terminal of the driving circuit 11.

Figure 9:
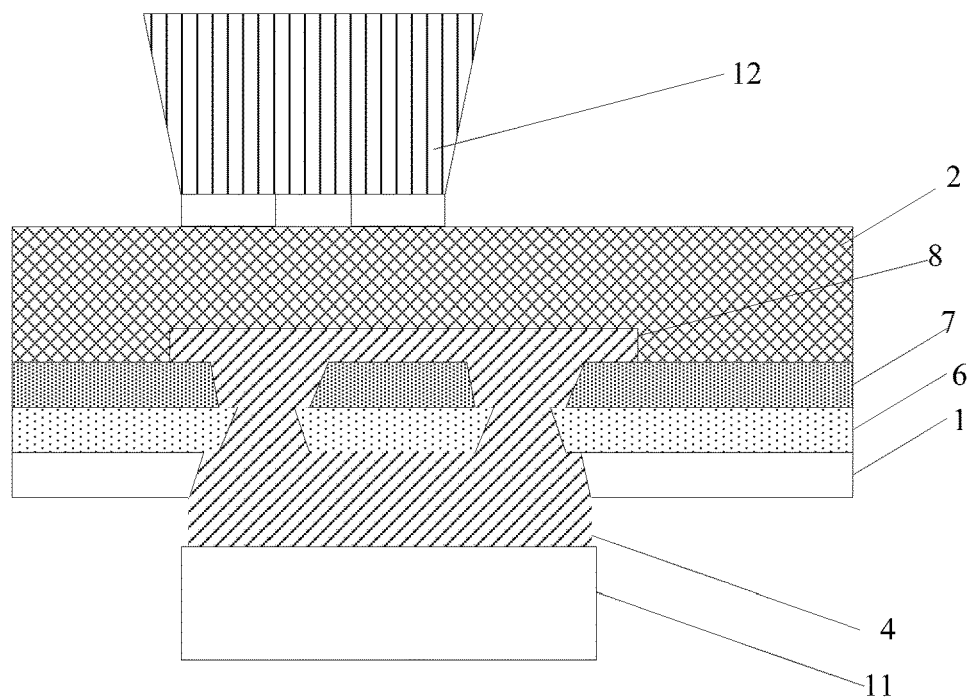
FIG. 9 is a schematic diagram after transferring a microLED according to one embodiment of the present disclosure.

Step 7: as shown in FIG. 9, the protective film 3 is removed, and a micro light-emitting diode 12 is transferred on one side of the display unit 2 away from the flexible substrate 1.

A micro light-emitting diode array substrate of the present embodiment may be obtained through the above steps. As shown in FIG. 9, in the embodiment, the driving circuit 11 is located on one side of the flexible substrate 1 away from the display unit 2, and the micro-light-emitting diode 12 and the display unit 2 are located on the other side of the flexible substrate 1, the signal input terminal of the display unit 2 is connected with the signal output terminal of the drive circuit 11 through the electroplating seed layer 8 and the signal connection structure 4. Since a size of a portion of the signal connection structure 4 located in the second via hole at one side of the portion of the signal connection structure 4 located in the second via hole close to the display unit 2 is larger than a size of the portion of the signal connection structure 4 located in the second via hole at one side of the signal connection structure 4 located in the second via hole away from the display unit 2, the signal connection structure 11 may be firmly fixed on the array substrate to ensure the display effect of the display device.

According to other embodiments of the present disclosure, the base substrate is a flexible substrate, and the method for manufacturing the array substrate may include the following steps.

Figure 10:
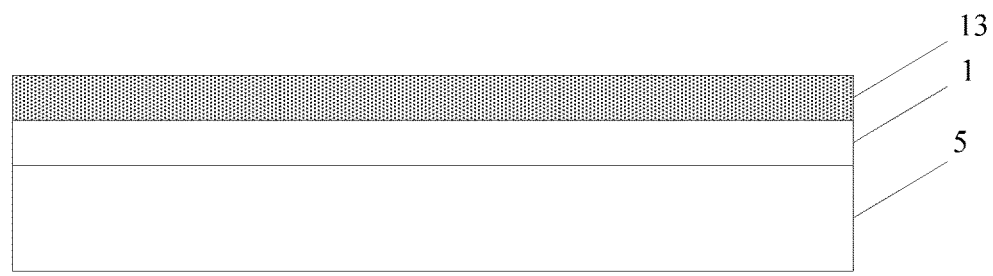
FIG. 10 is a schematic diagram illustrating forming a flexible substrate and a negative photosensitive material layer on a rigid carrier plate according to another one embodiment of the present disclosure.

Step 1: as shown in FIG. 10, a rigid carrier plate 5 is provided, a flexible substrate 1 is formed on the rigid carrier plate 5, and a negative photosensitive material layer 13 is formed on the flexible substrate 1.

The rigid carrier plate 5 may be a glass substrate or a quartz substrate; optionally, a layer of polyimide may be coated on the rigid carrier to form the flexible substrate 1.

Figure 11:
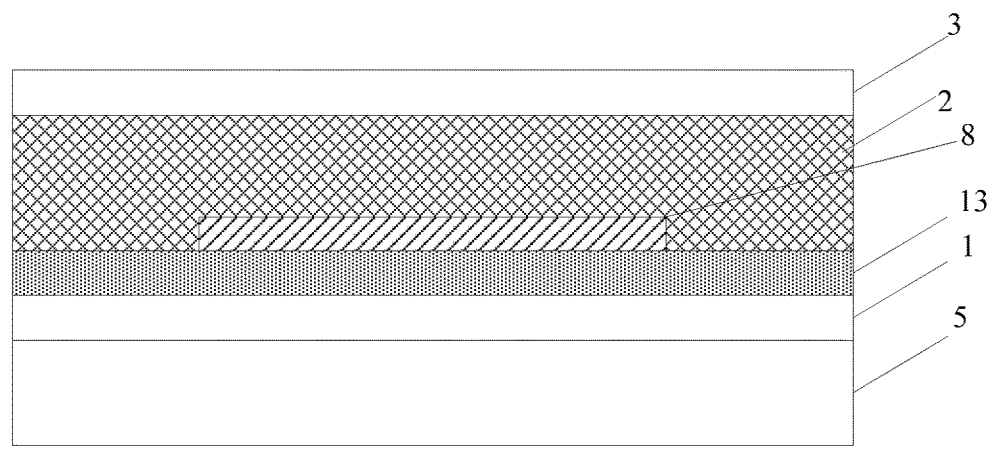
FIG. 11 is a schematic diagram after forming an electroplating seed layer, a display unit, and a protective film according to another one embodiment of the present disclosure.

Step 2: as shown in FIG. 11, an electroplating seed layer 8 and a display unit 2 are formed on the negative photosensitive material layer 13, the electroplating seed layer 8 is connected with a signal input terminal of the display unit 2, and a protective film 3 is formed to cover the display unit 2.

The electroplating seed layer 8 is used for a subsequent electroplating process and is made of conductive material; the display unit 2 includes a thin film transistor, an anode, a light emitting layer and a cathode, and may realize display under driving of an electric signal, and the signal input terminal of the display unit 2 is connected with the electroplating seed layer 8, and an electrical signal input through the electroplating seed layer 8 may drive the display unit 2 to display.

The protective layer 3 is resistant to high temperatures and may protect the display unit 2 in subsequent process processes.

Figure 12:
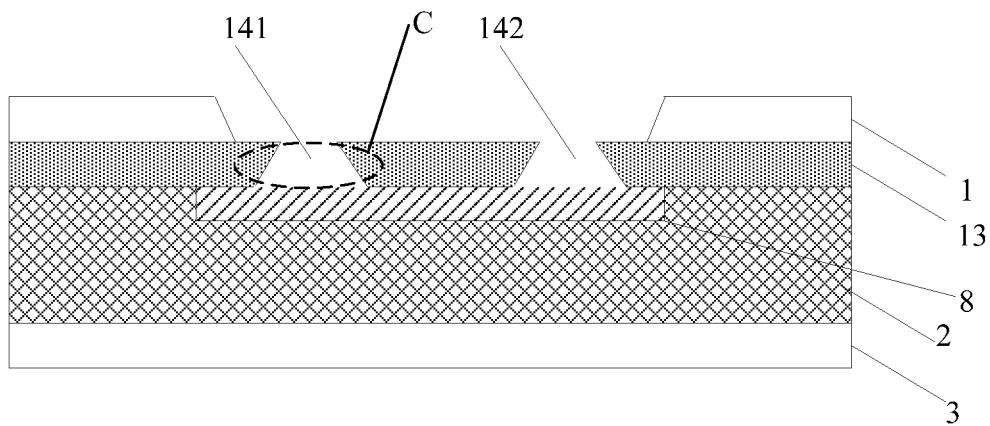
FIG. 12 is a schematic diagram after forming a substrate via hole and a third via hole according to another one embodiment of the present disclosure.

Step 3: as shown in FIG. 12, the flexible substrate 1 is removed from the rigid carrier plate 5, the flexible substrate 1 and the negative photosensitive material layer 13 are etched from one side of the flexible substrate 1 away from the display unit 2 to form a via hole structure 141 and a via hole structure 142.

Each of the via hole structure 141 and the via hole structure 142 is composed of a substrate via hole extending through the flexible substrate and a third via hole C extending through the negative photosensitive material layer, an orthographic projection of the third via hole C on the flexible substrate is located within that of the substrate via hole, a longitudinal section of the third via hole C is a third trapezoid, the electroplating seed layer 8 is exposed by the via hole structure 141 and the via hole structure 142.

Due to a photosensitive characteristics of the negative photosensitive material layer 13, a length of a bottom edge of the third trapezoid at one side of the third trapezoid close to the display unit is larger than a length of a bottom edge of the third trapezoid at one side of the third trapezoid away from the display unit, that is, a portion of the via hole structure for connecting a driving circuit and the display unit, i.e. the third via hole C, has a trapezoid longitudinal section, and a length of a bottom edge of the trapezoid at one side of the trapezoid close to the display unit is larger than a length of a bottom edge of the trapezoid at one side of the trapezoid away from the display unit.

Figure 13:
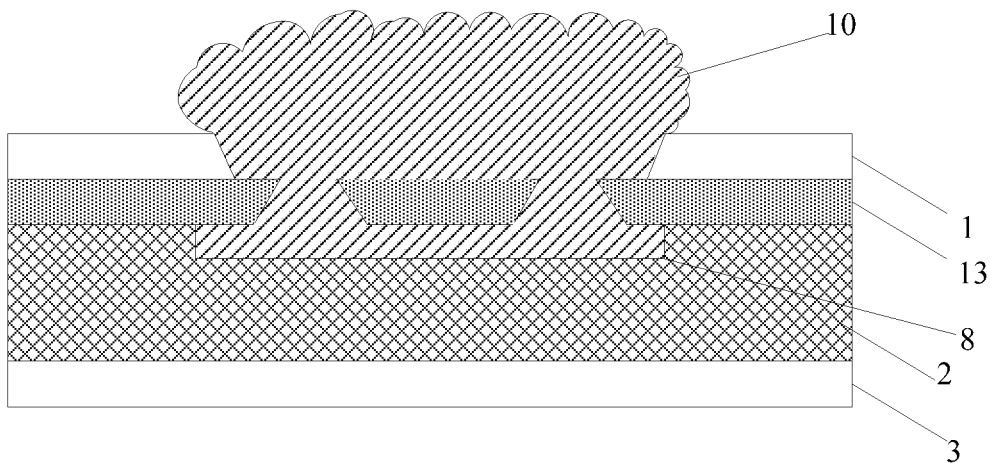
FIG. 13 is a schematic diagram illustrating forming a conductive pattern by using an electroplating process according to another one embodiment of the present disclosure.

Step 4: as shown in FIG. 13, a conductive pattern 10 is formed in the substrate via hole 141 and the substrate via hole 142 by an electroplating process, the conductive pattern 10 is in contact with the electroplating seed layer 8.

Figure 14:
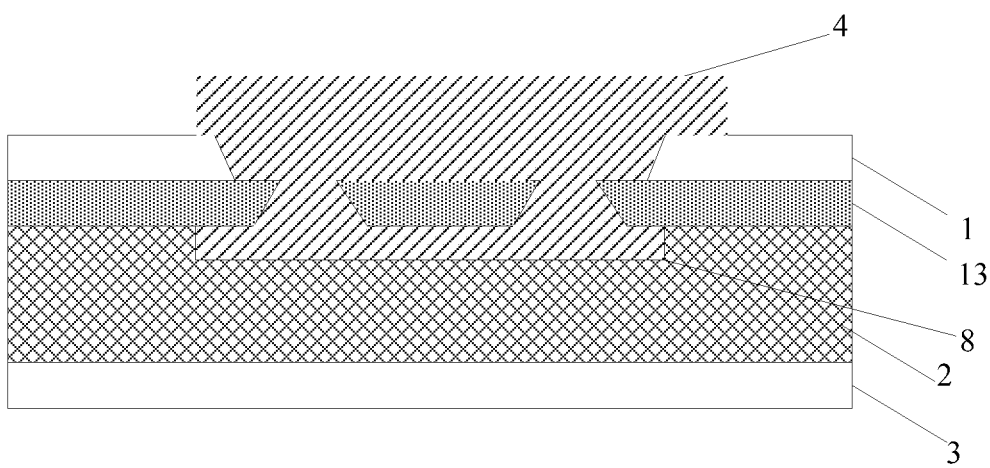
FIG. 14 is a schematic diagram illustrating forming a signal connection structure by performing the a CMP process on conductive patterns according to another one embodiment of the present disclosure.

Step 5: as shown in FIG. 14, a surface of the conductive pattern 10 protruding from the flexible substrate is polished by a chemical mechanical polishing process to form the signal connection structure 4.

Since a size of a portion of the conductive pattern 10 located in the third via hole C at one side of the portion of the conductive pattern 10 located in the third via hole C close to the display unit 2 is larger than a size of the portion of the conductive pattern 10 located in the third via hole C at one side of the portion of the conductive pattern 10 located in the third via hole C away from the display unit 2, the portion of the conductive pattern 10 located in the third via hole C may act as an anchor structure, which may increase the adhesion force between the conductive pattern 10 and the array substrate. When the conductive pattern 10 is polished by the chemical mechanical polishing process, the conductive pattern 10 is not easily detached from the array substrate, thereby reducing the probability of the conductive pattern falling off from the array substrate during the chemical mechanical polishing process, avoiding the abnormal connection and ensuring the display effect of the display device.

Figure 15:
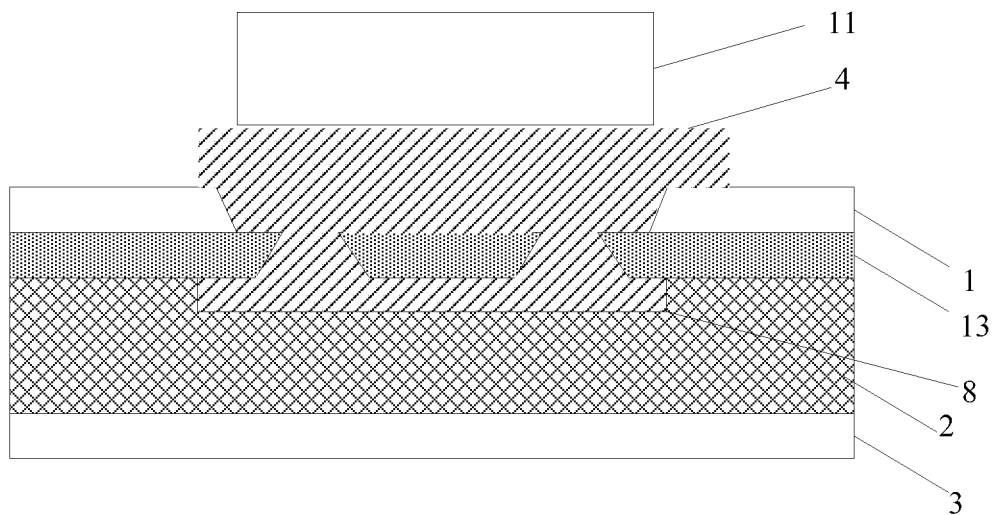
FIG. 15 is a schematic diagram after binding a driving circuit according to another one embodiment of the present disclosure.

Step 6: as shown in FIG. 15, binding a driving circuit 11 to one side of the flexible substrate 1 away from the display unit 2 is completed, the signal connection structure 4 is connected with a signal output terminal of the driving circuit 11.

Figure 16:
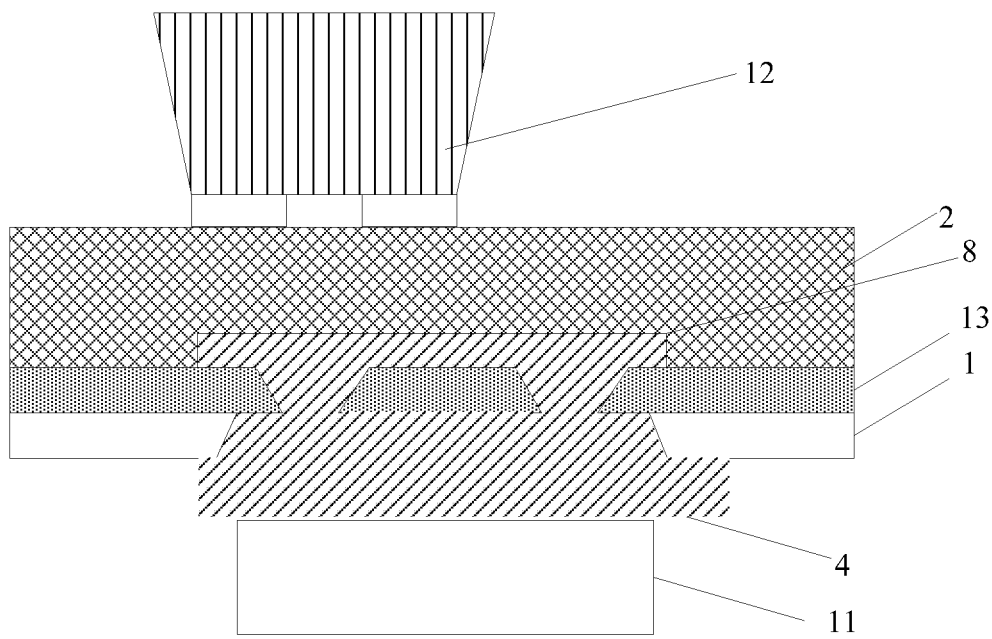
FIG. 16 is a schematic diagram after transferring a microLED according to another one embodiment of the present disclosure.

Step 7: as shown in FIG. 16, the protective film 3 is removed, and a micro light-emitting diode 12 is transferred on one side of the display unit 2 away from the flexible substrate 1.

A micro light-emitting diode array substrate of the present embodiment may be obtained through the above steps. As shown in FIG. 16, in the embodiment, the driving circuit 11 is disposed on one side of the flexible substrate 1 away from the display unit 2, and the micro-light-emitting diode 12 and the display unit 2 are disposed on the other side of the flexible substrate 1, the signal input terminal of the display unit 2 is connected with the signal output terminal of the drive circuit 11 through the electroplating seed layer 8 and the signal connection structure 4. Since a size of a portion of the signal connection structure 4 located in the third via hole at one side of the portion of the signal connection structure 4 located in the third via hole close to the display unit 2 is larger than a size of the portion of the signal connection structure 4 located in the third via hole at one side of the portion of the signal connection structure 4 located in the third via hole away from the display unit 2, the signal connection structure 11 may be firmly fixed on the array substrate to ensure the di splay effect of the di splay device.

In the method embodiments of the present disclosure, sequence numbers of the steps are not used for limiting sequences of the steps. For a person skilled in the art, changes of the sequences of the steps obtained without any creative effort also fall within the scope of the present disclosure.

Unless defined otherwise, technical or scientific terms in the embodiments of the present disclosure shall be of general meanings understood by a person skilled in the art. Terms "first", "second" and similar terms in the embodiments of the present disclosure do not indicate any order, quantity or importance, but are used only for distinguishing different components. A term "include", "comprise" or another term with similar meaning indicates that components or objects before the term cover components, objects or other equivalents listed after the term, instead of excluding other components or objects. A term "connect", "attach" or other term with similar meaning is not limited to a physical connection or a mechanical connection, but may include an electrical connection, whether direct or indirect. "Up", "down", "left", "right" and so on are only used to represent a relative position relationship. When an absolute position of an object is changed, the relative position relationship may also change accordingly.

It should be appreciated that when a component such as a layer, film, area or substrate is said to be located "above" or "below" another component, the component may be "directly" located "above" or "below" another component, or intermediate components may exist.

The embodiments described above are optional embodiments of the present disclosure, and it should be appreciated that a person skilled in the art may make various modifications and improvements without departing from the spirit and the scope of the present disclosure. The modifications and improvements shall also fall within the protection scope of the present disclosure.

What is claimed is:

1. An array substrate, comprising:
a base substrate;
a display unit disposed on a first surface of the base substrate;
a driving circuit disposed on a second surface of the base substrate opposite to the first surface; and
a plurality of via hole structures formed in the array substrate, a size of at least a portion of each of the plurality of via hole structures at one side close to the display unit is larger than that at one side away from the display unit,
wherein the driving circuit is electrically connected with the display unit through signal connection structures in the plurality of via hole structures, and the signal connection structure in each via hole structure completely fills the internal space of the via hole structure, and
wherein the signal connection structure is a metal filling formed by electroplating, and the signal connection structure is connected with a signal input terminal of the display unit and a signal output terminal of the driving circuit, respectively.

2. The array substrate according to claim 1, wherein each via hole structure consists of a plurality of via holes connecting with each other, wherein a longitudinal section of at least one of the plurality of via holes is a trapezoid, and a length of a bottom edge of the trapezoid at one side of the trapezoid close to the display unit is larger than a length of a bottom edge of the trapezoid at one side of the trapezoid away from the display unit.

3. The array substrate according to claim 2, wherein a first insulating layer and a second insulating layer are disposed between the base substrate and the display unit, and an etching rate of the second insulating layer is higher than an etching rate of the first insulating layer; the first insulating layer comprises a first via hole, a longitudinal section of the first via hole is a first trapezoid, the second insulating layer comprises a second via hole, and a longitudinal section of the second via hole is a second trapezoid, a length of a bottom edge of the second trapezoid at one side of the second trapezoid close to the display unit is larger than a length of a bottom edge of the second trapezoid at one side of the second trapezoid away from the display unit.

4. The array substrate according to claim 3, wherein a length of a bottom edge of the first trapezoid at one side of the first trapezoid close to the display unit is smaller than a length of a bottom edge of the first trapezoid at one side of the first trapezoid away from the display unit.

5. The array substrate according to claim 1, wherein a negative photosensitive material layer is disposed between the base substrate and the display unit, the negative photosensitive material layer comprises a plurality of third via holes, and each of the plurality of via hole structures is composed of a third via hole, a longitudinal section of the third via hole is a third trapezoid, a length of a bottom edge of the third trapezoid at one side of the third trapezoid close to the display unit is larger than a length of a bottom edge of the third trapezoid at one side of the third trapezoid away from the display unit.

6. A display device, comprising the array substrate according to claim 1.

* * * * *